United States Patent [19]
Kutz et al.

[11] Patent Number: 4,977,610
[45] Date of Patent: Dec. 11, 1990

[54] WIRELESS COMMUNICATION APPARATUS AND METHOD OF OPERATING SAME

[75] Inventors: Donald A. Kutz, Del Mar; Kenneth R. Fasen, San Diego, both of Calif.

[73] Assignee: H.M. Electronics, Inc., San Diego, Calif.

[21] Appl. No.: 425,418

[22] Filed: Oct. 23, 1989

Related U.S. Application Data

[63] Continuation of Ser. No. 176,939, Apr. 4, 1988, abandoned.

[51] Int. Cl.$^5$ .................................... H04A 11/12
[52] U.S. Cl. .................... 455/120; 455/125; 455/127; 333/194
[58] Field of Search ............... 455/89, 90, 95, 100, 455/128, 127, 129, 99, 114, 120, 126, 124, 125; 375/62; 333/196, 193, 194; 381/168, 95, 121, 122

[56] References Cited

U.S. PATENT DOCUMENTS

| | | | |
|---|---|---|---|
| 4,682,344 | 7/1987 | Somer | 375/62 |
| 4,764,978 | 8/1988 | Argo et al. | 455/1 |
| 4,774,482 | 9/1988 | Fleischmann | 333/194 |

Primary Examiner—Reinhard J. Eisenzopf
Assistant Examiner—Curtis Kuntz
Attorney, Agent, or Firm—Bernard L. Kleinke; William Patrick Waters; Jerry R. Potts

[57] ABSTRACT

A communication system includes a filter device for passing only a desired carrier frequency, and a circuit for splitting the passed carrier frequency into a pair of signals. A circuit for feeding back one of the signals to the filter device for causing an oscillation to occur at the desired carrier frequency for direct broadcast purposes.

12 Claims, 2 Drawing Sheets

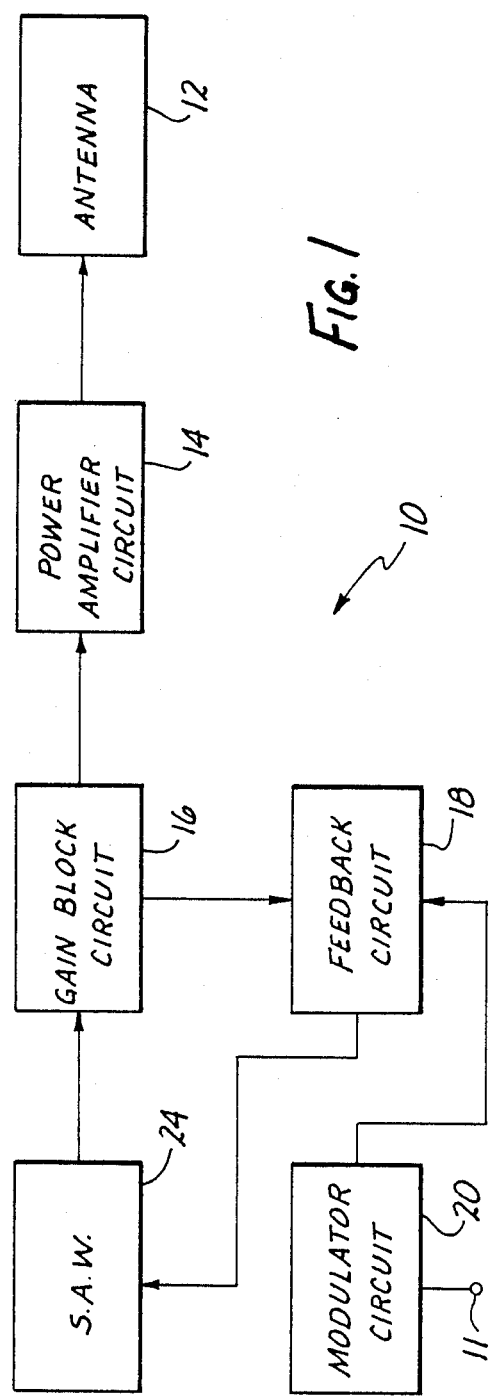
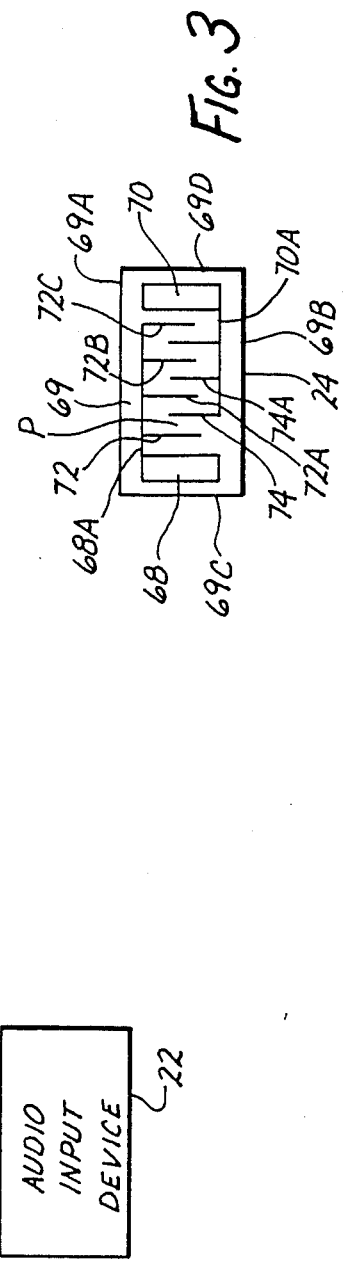

WIRELESS COMMUNICATION APPARATUS AND METHOD OF OPERATING SAME

This is a continuation of Ser. No. 176,939, filed Apr. 4, 1988, now abandoned.

TECHNICAL FIELD

The present invention relates in general to wireless communication systems, and it more particularly relates to improved modulation techniques, for radio communication systems.

BACKGROUND ART

The recent widespread use of wireless microphone systems in the entertainment field, has revealed several problematic areas that remain to be addressed and rectified. For instance, entertainers travel extensively, and perform on a multitude of stages, in diverse environmental surroundings. Each stage or other setting for the performance can present unique electrical interference conditions, which can severely and adversely affect the reception of the voice signals being transmitted over the short range wireless microphone radio system. In this regard, there are many spurious background signals present in any environment, especially where other electrical equipment is being used, and where there are other broadcast signals present.

One of the attempted solutions for overcoming the background interference problems, has been the provision of a pair of carrier frequencies, to enable the user to have a choice of carrier frequencies, in an attempt to find the one which is less affected by spurious interference signals.

As a further attempt to overcome the background interference problem, a group or spectrum of carrier frequencies have been employed. The additional frequencies provide a larger selection of frequencies from which to choose. However, this attempted solution has proven to be less than entirely satisfactory. Side-band producing multiplication stages are used in the modulation process, prior to transmission over an antenna, to achieve the larger number of carrier frequencies, and thus additional interference is introduced by such multiplication stages.

The conventional multiplication stages have been used, since conventional oscillators oftentimes include quartz crystals, which oscillate at relatively low frequencies. For instance, a quartz crystal typically oscillates at about 20 Megahertz. This frequency is multiplied by a desired factor (e.g., 8, 9, or 12), in order to achieve predetermined, authorized VHF or UHF carrier frequencies. However, each of the several multiplication stages generates undesired and unwanted side bands and harmonic signals, which adversely affect the quality of the transmitted signals, and interfere with other short range radio communication systems. Furthermore, each multiplication stage increases the physical size and expense of the communication systems. Such a system is proportionately more susceptible to malfunction than the dual frequency units, due to the increased number of electronic components used in the multiple frequency units.

Such side band problem is compounded where two or more wireless microphone systems operate simultaneously with the same receiver system, at different carrier frequencies. In such a multiple system, the undesired side bands and harmonic frequencies produced by one wireless microphone system can, and frequently does cause unwanted interference with other simultaneously operating microphone systems.

The problem is further complicated by crowded and limited authorized carrier frequencies, which compound frequency incompatibility. Numerous attempts have been made to overcome this problem. For instance, reference may be made to an article entitled "An Introduction to Wireless Microphone-Multiple System Frequency Compatibility", by Kenneth Fasen, presented at the 81st convention of the Audio Engineering Society, on Nov. 12, 1986 at Los Angeles, Calif. The article describes the causes of such frequency incompatibility, and suggests remedial techniques therefor. While these techniques have been successful for many applications, it would be highly desirable to avoid any and all of the multiple system incompatibility problems entirely, without the need to employ any remedial techniques.

Therefore, it would be highly desirable to have a short range radio communication system which greatly reduces, or even eliminates entirely, the side band and harmonic frequency interference problems, caused by successive multiplication stages. It would also be desirable to modulate directly the audio frequencies to predetermined VHF and UHF carrier frequencies, without the need for multiplier stages. Additionally, it would be highly desirable to reduce the size of the radio communication system, while rendering it lighter in weight to carry, more rugged to handle, and less expensive to manufacture. At the same time, such a communication system would be capable of functioning in a multiple system, without the need for remedial techniques for eliminating the foregoing mentioned interference problems associated with such multiple systems.

DISCLOSURE OF INVENTION

Therefore, it is the principal object of the present invention to provide a new and improved modulation technique for wireless communication systems.

Another object of the present invention is to provide such a new and improved communication system, which greatly reduces extraneous side band and harmonic frequency interference problems, and eliminates or at least greatly reduces the problems associated with multiple systems, without the need for remedial techniques.

Briefly, the above and further objects and features of the present invention are realized by providing a wireless communications system having improved modulation techniques.

The communication system includes a filter device for passing only a desired carrier frequency, and a circuit for splitting the passed carrier frequency into a pair of signals. A circuit for feeding back one of the signals to the filter device, causes oscillation to occur at the desired carrier frequency for direct broadcast purposes.

The filter device is preferably a surface acoustic wave device, which provides improved modulation techniques for direct frequency modulation at VHF and UHF carrier frequencies, without the need for multiplication stages. By utilizing the surface acoustic wave device, successive multiplication stages are not required, and thus the side bands and harmonic frequency interference problems experienced by prior known systems, are greatly reduced, if not completely eliminated. When used in multiple communication systems, such as multiple wireless microphone systems, the side band interference problems are totally obviated, or at least greatly reduced, since the inventive apparatus does not employ the prior known frequency multiplication stages.

The inventive system is more compact in size, and is lighter in weight. The system is more rugged to handle, and is relatively inexpensive to manufacture.

BRIEF DESCRIPTION OF DRAWINGS

The above mentioned and other objects and features of this invention and the manner of attaining them will become apparent, and the invention itself will be best understood by reference to the following description of an embodiment of the invention, in conjunction with the accompanying drawings, wherein:

FIG. 1 is a functional block diagram of a radio transmitter, constructed in accordance with the present invention;

FIG. 3 is a diagrammatic view of a surface acoustic wave device, used in the transmitter of FIG. 2.

BEST MODE FOR CARRYING OUT THE INVENTION

Figure 2:
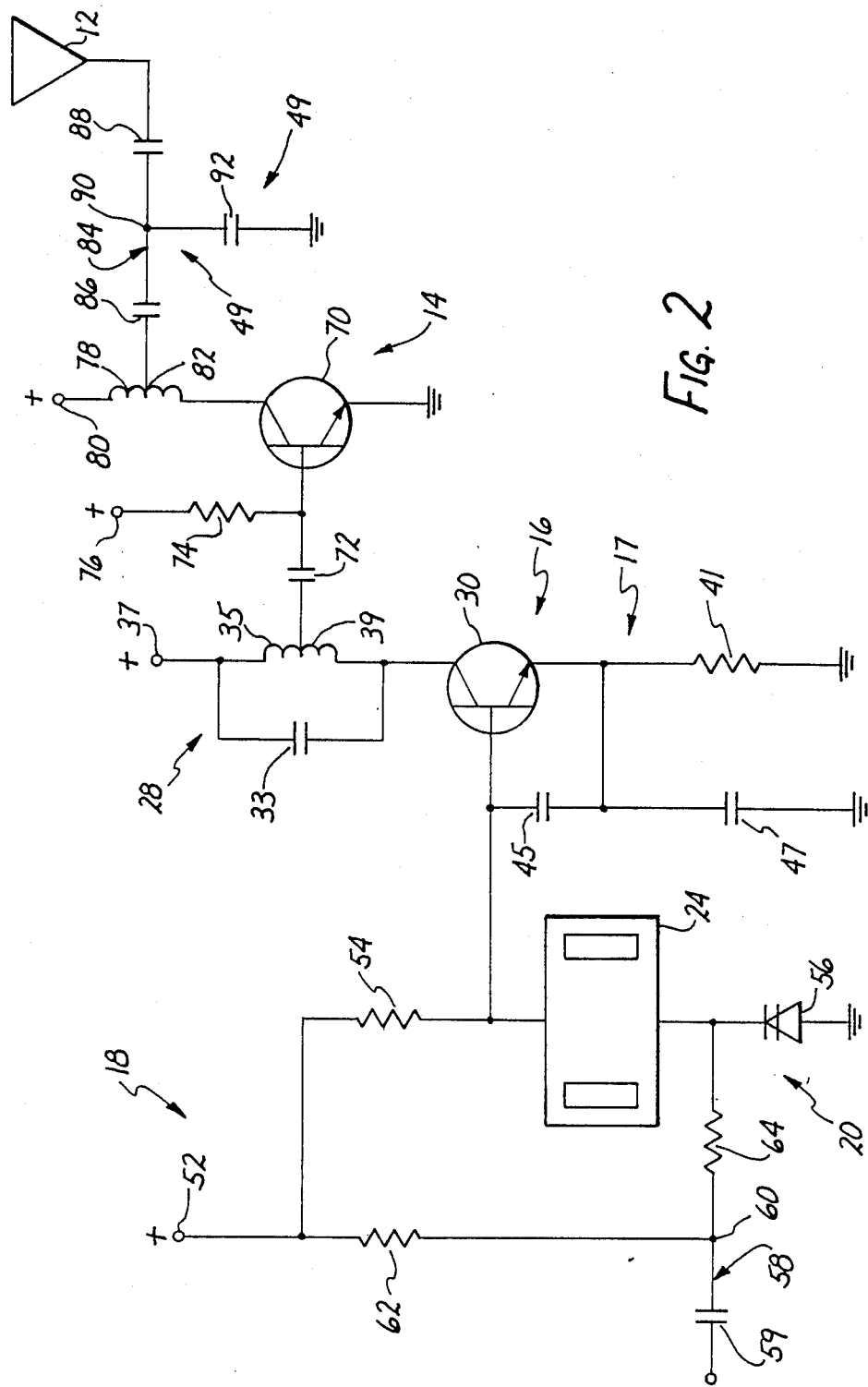
FIG. 2 is a schematic circuit diagram of the radio transmitter of FIG. 1.

Referring to the drawings, and more particularly to FIG. 1, there is illustrated wireless communication apparatus in the form of a radio transmitter 10, which is constructed in accordance with the present invention. The transmitter 10 generally comprises a modulator circuit 20 for receiving an audio input signal at its input terminal 11, from an audio input device 22, such as a microphone, and for modulating the audio input signal at a main carrier frequency. For the purpose of passing the -modulated signal at the predetermined main carrier frequency only, a surface acoustic wave device 24 serves as a high Q band-pass filter, and passes a predetermined frequency only, which, in turn, serves as the main carrier frequency for the transmitter 10.

A gain block circuit 16 splits the modulated signal at the output of the surface acoustic wave device 24, between a power amplifier 14, and a feedback circuit 18, which, in turn, is connected to the modulator circuit. An antenna 12 is connected to the output of the power amplifier circuit 14 for broadcast to a receiver (not shown). A feedback circuit 18 causes the filter device 24 to oscillate at the desired carrier frequency.

It should be noted that the need for the side band producing multiplication stages, has been eliminated.

In operation, the transmitter 10 receives the audio input signal from the audio input device, 22. The audio input signal is then modulated on the desired carrier frequency, by the modulator circuit 20. The modulated audio signal at the output of the modulator circuit 20 is then supplied to the surface acoustic wave device 24, which, in turn, passes the desired predetermined main carrier frequency only. The modulated signal at the output of the surface acoustic wave device 24, is then supplied to the gain block circuit 16, where it is split between the power amplifier 14 and the feedback circuit 18. The power amplifier 14 provides the necessary amplification for transmitting the signal from the antenna 12, to a receiver (not shown).

Considering now the modulator circuit 20 in greater detail, with reference to FIG. 2, and for the purpose of modulating an audio input signal at a predetermined main carrier frequency, the modulator circuit 20 generally comprises a suitably poled varactor diode 56 which is connected between ground potential and the device 24. For the purpose of receiving the audio input signal, an input path 58 extends between the input terminal 11, and the negative terminal of the varactor diode 56. The transmission path 58 generally comprises a resistor 64 and a capacitor 59.

The surface acoustic wave device 24 is diagrammatically illustrated in FIG. 3, and generally includes an input transducer 68, which imparts a surface acoustic wave replica of the input signal, over an elongated substrate portion 69, which serves as a propagation path. An output transducer 70, converts the delayed acoustic wave replica back to an electrical signal. The input and output transducers 68 and 70 are disposed on the substrate 69, and are spaced-apart near the marginal ends 69C and 69D of the substrate.

The substrate 69 is composed of a piezoelectric material. The surface acoustic wave device 24 further includes a bus bar 68A, which is connected to the transversely extending input transducer 68 on the substrate 69, and which extends longitudinally parallel to and spaced from the longitudinal marginal side edge 69A of the substrate 69 and terminates at a distance spaced from the transversely extending output transducer 70. A series of generally similar, transverse, parallel, longitudinally spaced-apart finger electrodes, such as the electrodes 72, 72A, 72B and 72C, are connected to and extend transversely from the bus bar 68A.

Similarly, the surface acoustic wave device 24 includes a longitudinal bus bar 70A and a series of transverse spaced-apart finger electrodes, such as the electrodes 74 and 74A, which are similar to the respective bus bar 68A, and the previously mentioned electrodes, such as the electrodes 72 and 72A. The bus bar 70A extends longitudinally on the substrate 69 spaced from the opposite longitudinal marginal side edge 69B thereof and parallel and spaced from the bus bar 68A. The bus bar 70A terminates spaced at a distance from the input transducer 68.

The electrodes 74 and 74A, are connected to the bus bar 70A, and extend transversely therefrom, and are longitudinally interleaved with the previously mentioned electrodes. Each electrode, such as the electrode 72A, extending from the bus bar 68A, terminates spaced at a distance from the opposite bus bar 70A. Similarly, the electrodes, such as the electrode 74A extending from the bus bar 70A, terminates at a distance from the bus bar 68A.

Each of the input and output transducers 68 and 70 has an impulse response with a finite duration. The impulse response center frequency is set by the spacing P of two successive electrodes, such as the electrodes 72 and 74. The surface acoustic wave device 24 operates as a high Q filter, with an overall transfer function, which is the product of the input and output transducer frequency responses, and with a delay generally proportional to the separation between the centers of the input and output transducers 68 and 70.

For particular applications, the following physical dimensions and arrangements of components may be varied, to achieve different characteristics: the width of the electrodes; the length of the electrodes; the interdigital spacing between the electrodes; the general electrode pattern arrangement; the thickness of the plating; and the spacing between the input and output transducers. The preferred characteristics of the surface acoustic wave device 24 for producing optimum results, when used as a part of a wireless microphone transmitter, are as follows:

Operating frequency range: 150–450 Megahertz;
Modulation sensitivity: 20 Kilohertz/vdt;
Audio frequency response: 50 cycles—15 Kilohertz; and
Temperature stability: ±0.05%.

Considering now the transmitter 10 in greater detail, with reference to FIG. 2, the gain block circuit 16 generally comprises an oscillator circuit 17, such as a Colpitts oscillator, and a resonator circuit 28.

The oscillator circuit 17 generally comprises a transistor 30, which has its base connected to the output of the surface acoustic wave device 24, and also to a capacitor 45. A capacitor 47 is connected at one of its ends to the capacitor 45 and to the emitter of the transistor 30, and is connected at its other end to ground potential. A resistor 41 is connected between the emitter of the transistor 30 and ground potential. The transistor 30 has its collector connected to the resonator circuit 28.

The resonator circuit 28 is tuned to the operation frequency of oscillation of the oscillator circuit 17. The resonator circuit 28, generally comprises a capacitor 33, which is connected between the collector of the transistor 30 and a power supply at 37. An inductor 35 is connected in parallel with the capacitor 33, between the collector of the <10227-01.203> transistor 30, and the power supply 37. In order to provide a first output to the power amplifier circuit 14, the inductor 35 is tapped at a point 39.

For the purpose of providing a second output of the gain block circuit 16 to the feedback circuit 18, a resistor 54 is connected at one of its ends to the base of the transistor 30 and to the device 24, and at its opposite end to the plus potential at 52. A resistor 62 is connected between the plus potential at 52, and a point 60, in the transmission path 58 of the modulator circuit 20, at a point 60, between a capacitor 59 and a resistor 64. The feedback circuit 18 causes the modulated signal at the output of the surface acoustic wave device 24 to be fed back to the modulator circuit 20.

Considering now the power amplifier circuit 14 in greater detail, it generally comprises a grounded emitter transistor 70, and a coupling capacitor 72 connected between the terminal 39 of the resonator circuit 28, and the base of the transistor 70. A biasing resistor 74 is connected between the base of the transistor 70 and a plus potential at 76. A center tapped inductor 78 is connected between the collector of the transistor 70 and a positive potential at 80. The variable inductor 78 is taped at a point 82, for connection to an antenna 12.

A antenna matching network 49 is connected between the terminal 82 of the power amplifier circuit 14, and the antenna 12, for impedance matching purposes. The antenna matching network 49 generally comprises a transmission path 84 extending between a point 82 and the antenna 12. The transmission path 84 generally comprises a pair of series connected capacitors 86 and 88. A capacitor 92 is connected between a point 90 between the capacitors 86 and 88, and ground potential.

While a particular embodiment of the present invention has been disclosed, it is to be understood that various different modifications are possible and are contemplated within the true spirit and scope of the appended claims. For example, the present inventive system can be employed in portable radios, mobile radios, frequency modulation transmitters, cordless telephones, garage door openers, radio controlled airplanes, and others. There is no intention, therefore, of limitations to the exact abstract or disclosure herein presented.

What is claimed is:

1. A transmitter for sending an audio signal comprising:
    means for receiving an analog audio signal;
    circuit means for controlling the amplitude of a carrier frequency signal;
    filter means for passing a predetermined frequency signal only, wherein said filter means includes a surface acoustic wave device, and wherein said predetermined frequency signal is a modulated carrier frequency signal;
    means for connecting directly said filter means and said circuit means to facilitate oscillation between said filter means and said circuit means;
    feedback means coupled to said filter means and to said circuit means for causing oscillation at a predetermined frequency, said predetermined frequency being a single carrier frequency;
    means for modulating said analog audio signal on said carrier frequency signal;
    means for coupling directly said means for receiving the audio signal, and said means for modulating to said surface acoustic wave device, for facilitating modulating said analog audio signal on said carrier frequency signal;
    said filter means, said feedback means and said circuit means defining oscillating means for generating a single carrier frequency signal; and
    means responsive to said oscillating means for broadcasting the modulated carrier frequency signal.

2. A transmitter according to claim 1 wherein said surface acoustic wave device includes a substrate, a pair of spaced-apart longitudinally extending bus bars on the substrate, a pair of transducers each connected to one of said bars, and a plurality of interleaved finger electrodes.

3. A transmitter according to claim 2, wherein said means for broadcasting includes resonator means coupled to a first output of said oscillating means, and power amplifier means having an input coupled to said resonator means.

4. A transmitter according to claim 3, wherein said means for broadcasting further includes an antenna coupled to the output of said power amplifier means.

5. A transmitter according to claim 2, wherein said modulating means includes a varactor diode.

6. A transmitter according to claim 5, wherein said modulating means includes a transmission path, said path including a resistor and a capacitor.

7. A transmitter for sending an audio signal comprising:
    oscillating means for generating a carrier frequency signal, said oscillating means including circuit means for controlling the amplitude of the generated carrier frequency signal, filter means for passing the carrier frequency signal only, said filter means including a surface acoustic wave device, and feedback means coupled to said filter means and to said circuit means for causing oscillation at said carrier frequency;
    means for modulating the audio signal on said carrier frequency signal; and
    means responsive to said oscillating means for broadcasting the modulated carrier frequency signal;

wherein said circuit means is gain block circuit means for facilitating oscillation at said carrier frequency;

wherein said surface wave device includes a substrate, a pair of spaced-apart longitudinally extending bus bars on the substrate, a pair of transducers each connected to one of said bars, and a plurality of interleaved finger electrodes;

wherein said means for broadcasting includes resonator means coupled to a first output of said oscillating means, and power amplifier means having an input coupled to said resonator means;

wherein said means for broadcasting further includes an antenna coupled to the output of said power amplifier means; and wherein said feedback means includes resistance means coupled to a second output of said gain block means.

8. A transmitter according to claim 7, wherein said gain block means includes a transistor.

9. A transmitter according to claim 8, wherein said power amplifier includes a transistor.

10. A transmitter according to claim 7, wherein said surface wave device includes a substrate, a pair of spaced-apart longitudinally extending bus bars on the substrate, a pair of transducers each connected to one of said bars, and a plurality of interleaved finger electrodes.

11. A transmitter according to claim 10, wherein said modulating means includes a varactor diode.

12. A transmitter for sending audio signals comprising:

means for receiving an analog audio input signal;

circuit means coupled to said receiving means for producing a modulated carrier frequency signal;

said circuit means including gain block circuit means for causing oscillator of a transmission signal and for controlling the amplitude of said modulated carrier frequency signal;

means responsive to said gain block circuit means for broadcasting the modulated carrier signal;

said circuit means further including modulation means for modulating said audio input signal on a single carrier frequency signal, said modulation means being coupled directly to said means for receiving said analog audio input signal and to said gain block circuit means; and said gain block circuit means including filter means responsive to said transmission signal for band passing to permit only said modulated carrier frequency signal to pass, said filter means including a surface acoustic wave device coupled to said modulating means.

* * * * *